United States Patent [19]

Ma

[11] Patent Number: 5,512,418
[45] Date of Patent: Apr. 30, 1996

[54] INFRA-RED SENSITIVE AQUEOUS WASH-OFF PHOTOIMAGING ELEMENT

[75] Inventor: Sheau-Hwa Ma, Chadds Ford, Pa.

[73] Assignee: E. I. du Pont de Nemours and Company, Wilmington, Del.

[21] Appl. No.: 29,038

[22] Filed: Mar. 10, 1993

[51] Int. Cl.$^6$ .............................. G03C 1/795; G03C 1/73; G03F 7/038
[52] U.S. Cl. .................... 430/271.1; 430/270.14; 430/325; 430/330; 430/294; 430/910; 430/944; 430/945; 430/964; 522/72; 522/151
[58] Field of Search .................... 430/270, 271, 430/325, 944, 910, 964, 926, 348, 330, 294, 292; 522/72, 151, 75; 526/292.2

[56] References Cited

U.S. PATENT DOCUMENTS

| | | | |
|---|---|---|---|
| 3,580,719 | 5/1971 | Brinckman | 430/325 |
| 3,645,733 | 2/1972 | Brinckman et al. | |
| 3,785,821 | 1/1974 | Notley | 430/944 |
| 4,693,958 | 9/1987 | Schwartz et al. | 430/302 |
| 4,788,128 | 11/1988 | Barlow | 430/200 |
| 4,920,036 | 4/1990 | Totsuka et al. | 430/270 |
| 5,019,549 | 5/1991 | Kellogg et al. | 503/227 |
| 5,147,758 | 9/1992 | Smothers et al. | 430/923 |
| 5,262,275 | 11/1993 | Fan | 430/944 |

FOREIGN PATENT DOCUMENTS

| | | |
|---|---|---|
| 0348961 | 1/1990 | European Pat. Off. . |
| 3213771 | 11/1982 | Germany . |
| 1155035 | 6/1969 | United Kingdom ............ 430/348 |

OTHER PUBLICATIONS

Patent Abstracts of Japan, vol. 14, No. 485 (C–0772) Oct. 23, 1990, & JP 02 202 513 (Toyo Ink Mfg. Co.), Aug. 10, 1990.
Patent Abstracts of Japan, vol. 8, No. 157, (P–288) Jul. 20, 1984 & JP 59 053 837 (Nippon Denshin Denwa Kosha) Mar. 28, 1984.

*Primary Examiner*—Janis L. Dote

[57] ABSTRACT

An aqueous processable element for thermally-induced photoimaging and a photoimaging process using the element are disclosed. The element comprises, in order:

(A) a dimensionally stable support, and
(B) an active layer comprising:

(1) a cationic polymer containing pendant ammonium groups, said cationic polymer being removable from said support by aqueous processing, said pendant groups having the general formula:

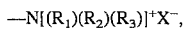

$-N[(R_1)(R_2)(R_3)]^+X^-$, (2) an infra-red absorbing material, and
(3) optionally, a colorant;

wherein:

$R_1$, $R_2$, and $R_3$ are independently selected from the group consisting of hydrogen, substituted and unsubstituted alkyl, substituted and unsubstituted alkenyl, and substituted and unsubstituted aryl;

$R_1$, $R_2$, and $R_3$ together contain not more than about thirty carbon atoms; and X is an anion.

5 Claims, No Drawings

1

INFRA-RED SENSITIVE AQUEOUS WASH-OFF PHOTOIMAGING ELEMENT

FIELD OF THE INVENTION

This invention relates to infra-red sensitive aqueous wash-off photoimaging elements. In particular this invention relates to elements comprising a support that bears an active layer comprising polymers containing amine salts and/or quaternized amine groups.

BACKGROUND OF THE INVENTION

Elements for image-reproduction are well-known in both the graphic arts and electronics industries. Such elements are typically imaged by exposure with actinic radiation through an image-bearing transparency, such as a color separation transparency. After imagewise exposure, the imaged element is typically processed by washout of soluble image areas, toning with a colorant, peeling apart, or combinations of these techniques.

Infra-red lasers have been developed as output devices for various image capture, storage, and processing systems. Since these lasers heat only a small region at a time, an image can be produced pixel by pixel. Computer control allows images of high definition to be produced at high speed. Elements that can be directly exposed by these lasers eliminate costly intermediate silver halide transparencies, and the associated processing chemicals, as well as reduce the time and effort required to prepare an image.

Many of the well-known imaging elements are processed in organic solvents or aqueous base. The use of organic solvents is frequently undesirable because of flammability, toxicity, and waste disposal considerations. The use of aqueous base is frequently undesirable because of toxicity, waste disposal, and corrosion problems. Thus elements that can be processed in aqueous solvents, preferably ordinary tap water, are desirable. Thus, there continues to be a need for aqueous processable photoimaging elements that can be directly imaged with infra-red radiation and processed in aqueous solvents, preferably ordinary tap water.

SUMMARY OF THE INVENTION

The invention is an aqueous processable element for thermally-induced photoimaging, said element comprising, in order:
(A) a dimensionally stable support, and
(B) an active layer comprising:
  (1) a cationic polymer containing pendant ammonium groups, said cationic polymer being removable from said support by aqueous processing, said pendant groups having the general formula:

$—N[(R_1)(R_2)(R_3)]^+X^-$, and (2) an infra-red absorbing material;
wherein:
$R_1$, $R_2$, and $R_3$ are independently selected from the group consisting of hydrogen, substituted and unsubstituted alkyl, substituted and unsubstituted alkenyl, and substituted and unsubstituted aryl;
$R_1$, $R_2$, and $R_3$ together contain not more than about thirty carbon atoms; and
X is an anion.

In one embodiment the element additionally comprises a colorant. In another embodiment this invention is a process for forming an image using these elements.

DETAILED DESCRIPTION OF THE INVENTION

The element comprises a support and an active layer. The active layer comprises of a cationic polymer and an infra-red absorbing material. The element is thermally imaged by using an infra-red light source and processed in an aqueous solvent.

Cationic Polymer

The cationic polymer has pendant quaternary ammonium groups of the general formula:

$—N[(R_1)(R_2)(R_3)]^+X^-$

The number of pendant quaternary ammonium groups per polymer chain must be sufficient to make the polymer removable from the support by an aqueous processing solvent, preferably ordinary tap water. The number will depend on the molecular weight and the chemical nature of the selected polymer.

The R groups are independently selected from the group consisting of hydrogen, substituted and unsubstituted alkyl, substituted and unsubstituted alkenyl, and substituted and unsubstituted aryl. Typical R groups are, for example: hydrogen, methyl, ethyl, n-propyl, i-propyl, n-butyl, n-pentyl, 2-ethylhexyl, n-octyl, allyl, phenyl, etc. Where substitution is possible, the R groups may be substituted with any of the well known substituents, such as cyano; alkoxy, such as, methoxy, ethoxy, 2-ethoxyethoxy, and benzyloxy; aryloxy, such as, phenoxy; provided the presence of the substituent does not adversely affect the properties of the polymer, the active layer, or the photosensitive element needed for the operation of the element. Substituted R groups include, for example: 2-hydroxyethyl, 2-methoxyethyl, benzyl, p-tolyl, 3-fluorophenyl, etc. Preferred R groups are hydrogen, methyl, ethyl, n-propyl, i-propyl, and benzyl. For aqueous processability, $R_1$, $R_2$, and $R_3$ together should not contain more than about thirty carbon atoms, preferably not more than about sixteen carbon atoms.

X is the anion that balance the charge on the polymer. Typical anions are: halide, for example, chloride, bromide, and iodide; sulfate; alkylsulfate, for example, methylsulfate; sulfonate, for example, benzenesulfonate, trifluoromethanesulfonate, p-toluenesulfonate, methanesulfonate; nitrate; and carboxylate, for example, formate, acetate, butyrate, trifluoroacetate, oxalate, glycolate, lactate, etc.

The polymer may be a homopolymer, copolymer, block polymer, or branched or grafted polymer. Methods of preparing such polymers are numerous and well known to those skilled in the art, such as, for example, by free-radical initiated solution, emulsion, suspension, or bulk polymerization, or by stepwise polymerization processes. Graft polymers may be prepared by attaching the amine to an preformed polymer.

The ammonium groups can be directly incorporated into the polymer by using monomers containing quaternary amines. More typically, and preferably, the amines are converted to the quaternary ammonium form after polymerization of amine containing monomers. Examples of useful amine containing monomers include, for example: 2-(N,N-dimethylamino)ethyl acrylate and methacrylate, 2-(N,N-diethylamino)ethyl acrylate and methacrylate, 2-(t-butylamino)ethyl acrylate and methacrylate, 2-(N-morpholino)ethyl acrylate and methacrylate, 4-aminostyrene, 2-vinylpyridine, 4-vinylpyridine, and the like.

As is known to those skilled in the art, the amine and/or ammonium salt containing monomers can be copolymerized with one or more additional monomers to adjust the physical properties, particularly the solubility, of the polymer. Typical monomers that may be used include those well-known to skilled in the art, for example: acrylate and methacrylate esters, such as, methyl acrylate and methacrylate, ethyl acrylate and methacrylate, propyl acrylate and methacrylate, n-butyl acrylate and methacrylate, hexyl acrylate and methacrylate, 2-ethylhexyl acrylate and methacrylate, phenyl acrylate and methacrylate, 2-phenylethyl acrylate and methacrylate, 2-hydroxyethyl acrylate and methacrylate, 3-hydroxypropyl acrylate and methacrylate, 4-hydroxybutyl acrylate and methacrylate, 2-phenoxyethyl acrylate and methacrylate, furfuryl acrylate and methacrylate; styrene; alpha-methyl styrene; vinyl naphthalene; vinylidene chloride; vinyl esters, such as, vinyl acetate; vinyl ethers, such as, methyl vinyl ether; vinyl chloride; acrylonitrile; etc.

Alternatively, the amine containing polymer may be prepared by functionalization of a preformed polymer. Polymers containing appropriate functional groups may be reacted with ammonia and/or amines to form the amine groups on the polymer. For example, a polymer or copolymer of glycidyl methacrylate may be reacted with an amine.

The amines can be converted to ammonium groups by reaction with acids, provided the acid selected is strong enough to convert the amine to the ammonium form. Typical acids are: organic acids such as acetic acid, formic acid, oxalic acid, dimethylol propionic acid, glycolic acid, lactic acid, etc., and mineral acids, such as hydrochloric acid, hydrobromic acid, sulfuric, etc.

Tertiary amine groups can also be converted to ammonium groups by reaction with alkylating agents such as benzyl chloride, methyl p-toluene sulfonate, ethyl p-toluene sulfonate, dimethyl sulfate, diethyl sulfate, methyl iodide, ethyl chloride, and the like.

Alternatively, amine containing polymers or cationic polymers can be prepared by the reaction of preformed polymers containing alkylating groups with ammonia and/or amines. For example, a cationic polymer may be prepared by reaction of a polymer or copolymer of chloromethyl styrene with a tertiary amine, such as trimethyl amine.

Preferred cationic polymers and copolymers of amine containing monomers with methyl methacrylate that have been quaternized by reaction with a carboxylic acid or a mineral acid or by reaction with an alkylating group containing seven or fewer carbon atoms, such as benzyl chloride, ethyl chloride, etc.

The active layer may contain a second polymer to modify adhesion, flexibility, hardness, moisture sensitivity and other mechanical or chemical properties required during its processing or end use. This polymeric modifier may contain functional groups that are compatible with the active polymer, such as amine, alcohol, etc. It may be present in an amount effective for the intended purpose, provided its presence does not adversely affect the properties of the element, especially the solubility characteristics of the active layer, required for operation of the element.

Infra-Red Absorbing Material

For the active layer to be imaged by the laser, the active layer must contain an infra-red absorbing material. The infra-red absorbing material must have a strong absorption in the emission region of the exciting laser (typically 750–870 nm) and should have good thermal stability so that it is not decomposed by the imaging radiation. While the infra-red absorbing material and the colorant may be the same material, the need to match the infra-red absorption of the colorant to the emission of the laser greatly restricts the number of colorants that can be used. The use of carbon black and graphite, which may serve as both colorant and infra-red absorbing material is well known.

As an alternative, the active layer may be imaged by incorporating therein a separate infra-red absorbing material. For color applications it is essential that the separate infra-red absorbing material be essentially non-absorbing in the visible so that small amounts used will not affect the color quality of the image.

Numerous infra-red absorbing materials are known (see, for example, *Infra-red Absorbing Materials*, M. Matsuoka, Ed, Plenum, New York, 1990). Infra-red absorbing compounds useful in photosensitive elements have been disclosed by, for example: Barlow, U.S. Pat. No. 4,778,128 (poly-(substituted)-phthalocyanine compounds); DeBoer, EPO Application 0 3121 923 (cyanine dyes); DeBoer, U.S. Pat. No. 4,942,141 (selected squarylium dyes); Evans, U.S. Pat. No. 4,948,776 (chalcogenopyryloarylidene dyes); Evans, U.S. Pat. No. 4,948,777 (bis-(chalcogenopyrylo)polymethine dyes); DeBoer, U.S. Pat. No. 4,948,778 (oxyindolizine dyes); DeBoer, U.S. Pat. No. 4,950,639 (bis-(aminoaryl)polymethine dyes); Evans, U.S. Pat. No. 4,950,640 (merocyanine dyes); and Chapman, U.S. Pat. No. 4,952,552 (quinoid dyes). Infra-red absorbing indolenine dyes, such as disclosed in West, U.S. Pat. No. 5,107,063, and Laganis, U.S. Pat. No. 4,882,265, and the squarylium dyes disclosed in Kellogg, U.S. Pat. No. 5,019,549, can be used to advantage. Another useful infra-red absorbing material is IR-125 (absorption maximum 795 nm), an indocyanine dye available from Eastman Kodak, Rochester, N.Y. This material has little or no absorption in the visible.

A preferred infra-red absorbing material is SQS, a squarylium dye described in Kellogg, U.S. Pat. No. 5,019,549. It has strong absorption in the infra-red and little or no absorption in the visible. The absorption maximum, 814 nm, coincides with the wavelength of emission of readily available infra-red diode lasers (750–870 nm). A procedure for the synthesis of SQS is given in Gravesteijn, U.S. Pat. No. 4,508,811.

The infra-red absorbing materials should be present in any concentration that is effective for the intended purpose, i.e., to absorb sufficient infra-red radiation to produce the desired change in solubility of the active layer. In general, for the organic compounds, concentrations of 0.1 to 10% of the total coating weight of the layer in which the infra-red absorbing material is contained have been found to be effective. A preferred concentration is 1 to 6% of the total coating weight. When carbon black or graphite is used in the active layer, since they are also used as the colorant, a much higher level, 5 to 50% of the total coating weight, is commonly used in order to achieve the optical density desired for the image.

Colorant

If a precolored element is desired, one or more colorants can be present in the active layer. Dyes and pigments may be used as colorants. Dyes are known to have superior color properties such as chroma and transparency, but usually are not as lightfast and thermally stable as the pigments. Water soluble dyes such as acid dyes, direct dyes, and basic dyes should be avoided because they can be washed off during the processing step. Useful pigments comprise a wide range of organic and inorganic pigments.

Important criteria for the selection of the colorant are chemical and thermal stability, hue, color strength and purity, lightfastness, solubility or dispersability in the chosen coating solvent, and other properties required for the intended applications. A detailed list of commercial dyes and pigments can be found in the "Buyer's Guide For Textile Chemists and Colorists,", published by American Associate of Textile Chemists and Colorists, Research Triangle Park, N.C.

Other Ingredients

It is preferable for the pigment particles to be dispersed and stabilized with a dispersant, preferably a polymeric dispersant. A wide range of pigment dispersants are commercially available. Dispersants are listed *McCutcheon's Functional Materials,* North American Edition, Manufacturing Confection Publishing Co., Glen Rock, N.J., 1990, pp 110–129. A dispersant will be selected according to the characteristics of the pigment surface and other components in the composition as practiced by those skilled in the art. A high quality dispersion can be conveniently prepared by conventional milling techniques and a suitable dispersant. Caution should be taken that the dispersant does not contain functional groups which will interact with the cationic polymer, as this may impede the desired thermal reaction, inhibit the aqueous processing step, or adversely affect the coating quality by flocculating the pigment dispersion. Preferably, the dispersant contains similar types of functional groups as the active polymer. Small pigment particle size will be desirable for maximum color strength, transparency, gloss, and dispersion stability.

The active layer may also contain other ingredients that are conventional components of such elements, such as, plasticizers, surfactants, adhesion promoters, coating aids, etc., provided such additional components are compatible with the other components of the element and do not adversely affect the properties of the active layer or the element needed for the operation of the element.

Support

The support may be virtually any substrate that has the necessary stiffness and dimensional stability, that exhibits proper adhesion to the active layer, and that is capable of withstanding the aqueous processing step. The selection of a particular substrate will depend upon the intended application.

For the preparation of colored images polymer films may be used. A preferred material is polyethylene terephthalate film. A removable support is required for the preparation of a multicolor image. A separate release layer may be situated between the support and the active layer, or silicon release treated polyethylene terephthalate may be used. The support is typically about 25 to about 125 microns thick.

In applications such as printing plates, solder masks and printed circuits boards, the support may be opaque and contain metal or plastic. Typical substrates for resist applications include combinations such as phenolic or epoxy resins on paper or paper-glass composites, as well as polyester, epoxy, polyimide, polytetrafluoroethylene or polystyrene on glass. In most instances, these substrates are also clad with thin layer of electroconductive metal, typically copper. Typical substrates for printing plates include: metal sheets, such as, aluminium, anodized aluminum (for lithographic printing), copper clad aluminum, tin-plated steel, zinc, etc, preferably about 0.013 to about 0.08 cm thick, as well as various polymer films.

Manufacture

The element may be conveniently prepared by dissolving and/or suspending the ingredients of the active layer in a suitable solvent, coating them on the support, and evaporating the solvent.

Image Formation

Imagewise exposure of the active layer is conveniently accomplished by imagewise exposure of the element with an infra-red laser. Following exposure, the unimaged areas are removed by processing with an aqueous solvent. Exposure is typically carried out by direct exposure of the active layer, but exposure may be carried out through the support if the support is transparent to actinic radiation. Actinic radiation is any radiation that produces images.

Although various types of lasers may be used for exposure, diode lasers emitting in the region of 750 to 880 nm offer substantial advantage in terms of their small size, low cost, stability, reliability, ruggedness, and ease of modulation. Diode lasers emitting in the range of 800 to 880 nm are preferred. Such lasers are commercially available from, for example, Spectra Laboratories, San Jose, Calif.

Following exposure the image is revealed by processing in an aqueous solvent. Processing removes unexposed regions of the active layer from the support but does not remove the exposed regions. Aqueous solvents include water and mixtures that consist essentially of water. A low level of surfactant may be used to enhance the interaction between the active layer and the solvent. By solvent is meant the liquid in which the element is processed, even though it may not actually dissolve the cationic polymer in the unexposed regions. Tap water is the preferred processing solvent.

Following exposure and processing, a one-color image is produced. To prepare a multicolor overlay proof a series of one color images is prepared, each on a transparent support. Each one-color image corresponds to a color separation. The series of one-color images is then stacked in register on a white background to produce a multicolor overlay proof. A typical overlay proof consists of yellow, magenta, cyan, and black images, each produced from the corresponding color separations.

To prepare a multi-color surprint proof, elements that additionally comprise a thin (about 1 micron thick) layer of heat sensitive adhesive between the support and active layer are used. Heat sensitive adhesives, such as, ethylene/vinyl acetate copolymers, that are non-tacky at room temperature but become tacky during the lamination step (i.e., have a softening point in the range of 70° C. to 100° C.) may be used.

In the transfer in register process, a series of exposed and processed images, each corresponding to a different color separation of the multicolor image to be reproduced, is prepared as described above. The first exposed and processed active layer is laminated to a transfer sheet. The support is removed revealing the layer of heat sensitive adhesive. Alternatively, if the layer of heat sensitive adhesive is not present, a thin layer of adhesive may be coated on the image revealed by removal of the support.

The second exposed and processed active layer is laminated in register to the previously formed image on the transfer sheet and the support removed. The process is repeated for each of the images. The multi-color image is transferred to the desired substrate by laminating the image to the substrate. The transfer sheet is preferably removed following lamination, but, if transparent, it may be left in place to protect the image. Although the image can be transferred to any of numerous substrates, such as, for example, paper, cloth, wood, glass, china, metal sheet, polymer film, and the like, in proofing applications it will be transferred to the same paper on which the image will be printed.

The transfer sheet typically consists of a dimensionally stable support on which is coated at least one layer of polymer. Transfer sheets are described in, for example, Shinozaki, U.S. Pat. No. 4,766,053, and Platzer, U.S. Pat. No. 5,094,931.

Alternatively, images may be prepared by the expose in register process. Typically, an element comprising a releasable support, the active layer, an adhesive layer, and a coversheet will be used. The coversheet is removed revealing the adhesive layer, which is laminated to a permanent support to form an element consisting of permanent support, adhesive layer, active layer, and releasable support. The releasable support is removed. The element is exposed and processed to form a one color image.

The coversheet is removed from a second element, and the element, minus the coversheet, laminated to the previously formed image. The releasable support is removed and the active layer of the second element exposed in register with the previously formed image and processed to form a two color image. The process may be repeated as many times as desired to form a multicolor image.

Industrial Applicability

This invention is particularly useful in the field of graphic arts, such as printing plate, imagesetting, color proofing, and in the field of electronics, such as resists for printed circuit boards, etc.

The invention is also suitable for use in producing a photomask for conventional imaging applications and may advantageously be integrated into such a system by laminating a precolored element of the present invention to a photopolymer composition, for example. The composite structure is then imaged as described herein to create the mask, and is then exposed in the normal manner. After removal of the photomask, the exposed element may then be processed in the usual way.

The advantageous properties of this invention can be observed by reference to the following examples which illustrate, but do not limit, the invention.

EXAMPLES

| GLOSSARY | |
|---|---|
| AIBN | 2,2'-Azobis(i-butyronitrile) |
| DMAEMA | 2-(N,N-Dimethylamino)ethyl methacrylate |
| MMA | Methyl methacrylate |
| SQS | 4-[[3-[[2,6-Bis(1,1-dimethylethyl)-4H-thiopyran-4-ylidene]methyl]-2-hydroxy-4-oxo-2-cyclobuten-1-ylidene]methyl-2,6-bis(1,1-dimethylethyl)thiopyrylium hydroxide, inner salt; CAS 88878-49-3 |

Example 1

This example illustrates the preparation of Resin I, a MMA/DMAEMA (4/3 by weight) random copolymer.

To a 1 L flask equipped with a mechanical stirrer, a reflux condenser, and an addition funnel, a mixture of 75 g (0.48 mol) DMAEMA; 100 g (1.0 mol) MMA; and 1.75 g AIBN, was added dropwise to 200 mL of 2-propanol at a rate to maintain gentle reflux. Following addition, the solution was heated at reflux for 4 hr. The reaction mixture was cooled and poured into 1 L of water with agitation to from a insoluble viscous polymer mass.

The viscous polymer mass was transferred to a Model 7011G Waring blender and fresh water added. The polymer was broken into small pieces, filtered and dried in vacuo at 50° C. to give a white solid.

Example 2

This example illustrates the preparation of Resin II, a MMA/DMAEMA (2/1 by weight) random copolymer quaternized with benzyl chloride.

Resin II was prepared from 50 g (0.32 mol) DMAEMA, 100 g (1.0 mol) MMA, and 1.5 g AIBN, in 600 mL of 2-propanol as described in Example 1. The clear solution was allowed to cool over night. At about 43° C., 24.2 g (0.19 mol) benzyl chloride was added and the mixture heated at reflux for 6 hr. The solvent was removed and the product dried in vacuo at 50° C. to give a white solid.

Example 3

This example illustrates the preparation of Resin III, a MMA//MMA/DMAEMA (10//5/7.5) AB block copolymer at 54% solids. Mn=2700. (Note: A double slash indicates a separation between blocks, a single slash indicates a random copolymer, and the numerical values indicate the degree of polymerization of each monomer.)

A 12-L flask was equipped with a mechanical stirrer, thermometer, nitrogen inlet, drying tube outlet, and an addition funnel. Tetrahydrofuran, 3943 g, and p-xylene, 2.4 g, were charged to the flask. Tetrabutyl ammonium m-chlorobenzoate (2.6 mL of a 0.1M solution in acetonitrile) was added. Initiator, 1-methoxy-1-trimethylsiloxy-2-methyl propene, 241.1 g (1.57 mol) was injected. Feed I [a mixture of MMA, 780 g (7.8 mol), and DMAEMA, 1846 g (11.76 mol)] was started at 0.0 min and added over 45 min. One hundred minutes after Feed I was completed (over 99% of the monomers had reacted), Feed II [methyl methacrylate, 1556 g (15.6 mol)] was started and added over 0.5 hr.

At 400 min, 546 g of dry methanol was added to the above solution and distillation was begun. A total of 2025 g of solvent was removed. 2-Propanol, 1331 g, was added after completion of the distillation to give the Resin III solution at 54% solids.

Example 4

This example illustrates the reaction of Resin III with benzyl chloride to prepare a solution of Resin IV.

A 3-L flask was equipped with a mechanical stirrer, thermometer, nitrogen inlet, drying tube outlet, and an addition funnel. Resin III polymer solution (Example 3), 1590 g (2.30 mol of amine groups), was charged to the flask. Benzyl chloride, 272 g (2.14 mol) was added over 0.5 hr. The polymer solution was then heated to reflux for 6 hr. The amine value dropped from 2.70 meq/g of solid polymer to 0.16 meq/g.

2-Propanol, 400 g, was added to make a solution of a benzyl chloride quaternized polymer of MMA//MMA/DMAEMA (10//5/7.5) at 50% solids and an average molecular weight of 3650.

Example 5

A mixture of 20 g of Enduraphthal® Blue BT-583D pigment (Cookson Pigments, Newark, N.J.), 25.4 g of Resin IV solution (Example 4), and 154.6 g of deionized water was stirred until no lumps of pigment were visible. The mixture was continuously passed through a microfluidizer (Microfluidics, Newton, Mass.) at a pressure of approximately 7,000 psi for 20 min to give a 10% pigment dispersion with fine particles, 130 nm as determined by a Brookhaven BI-90 particle sizer (Brookhaven Instruments, Holtsville, N.Y.).

Resin I (0.2 g) and SQS (0.0125 g) were dissolved in 2.8 g of 2-propanol. The resulting solution was slowly added to 2 g of the dispersion with vigorous agitation. The resulting mixture was coated on about 75 micron thick resin-subbed clear polyethylene terephthalate film using a 0.008" wire wound coating bar to produce an element consisting of active layer and support.

The active layer was directly exposed with a Crossfield 646 scanner modified with infra-red laser diodes emitting at 830 nm as the light source (Spectra Laboratories, San Jose, Calif.) using an about 80 lines/cm screen. The exposed element was processed under running tap water. The unexposed areas were removed with gentle rubbing.

At about 400 mJ/cm$^2$ exposure energy, a high density high resolution bright cyan image with dots of sharp edges on a clear background was obtained. The reflective optical density measured by a X-Rite densitometer (X-Rite Inc., Grandville, Mich.) using a sheet of white bond paper as backing was 1.72. The dot range was 5–98%.

Example 6

A 20% yellow pigment dispersion containing 25 g Sunbrite® Yellow 83 pigment (Sun Chemical, Cincinnati, Ohio), 31.8 g of Resin IV solution, and 68.2 g of deionized water was prepared using the procedure of Example 5. The resulting dispersion had a particle size of 203 nm. SQS (0.04 g) and Resin I (0.7 g) were dissolved in 9.8 g of 2-propanol. To 2.0 g of the yellow pigment dispersion was slowly added 3.0 g of SQS solution with vigorous agitation to give a homogeneous mixture which was coated, exposed, processed, and evaluated as in Example 5.

At about 600 mJ/cm$^2$ exposure energy, a high density high resolution bright yellow image with dots of sharp edges on a clear background was obtained. Reflective optical density: 1.73. Dot range: 5–79%.

Example 7

A mixture of 0.5 g of carbon black (Degussa, Allendale, N.J.), 1.0 g of Resin I, 0.07 g of glycolic acid (Aldrich, Milwaukee, Wis.), 4.0 g of 2-propanol, and 4.4 g of deionized water was roll-milled with 25 g of 3/32" steel shot over night. The resulting dispersion was coated, exposed, processed, and evaluated as in Example 5 except that a 60 lines/cm screen was used.

At about 400 mJ/cm$^2$ exposure energy, a high density high resolution black image with dots of sharp edges on a clear background was obtained. Reflective optical density: 2.41. The dot range: 2–98%.

Example 8

A mixture of 0.4 g of carbon black fw18, 0.3 g of Resin I, 0.3 g of Resin II, 5.0 g of 2-propanol, and 4.0 g of deionized water was roll-milled with 25 g of 3/32" steel shot over night to prepare a black pigment dispersion. The mixture was coated, exposed, processed, and evaluated as in Example 5 except that a 60 lines/cm screen was used. At about 400 mJ/cm$^2$ exposure energy, a high density, high resolution black image with dots of sharp edges on a clear background was obtained. Reflective optical density: 2.15. Dot range: 2–95%.

Example 9

A mixture of 1.2 g of Monastral® Magenta RT-143D pigment (Ciba Geigy, Newport, Del.), 1.2 g of Resin III solution, 0.1 g of glycolic acid, and 9.5 g of deionized water was roll-milled with 25 g of 3/32" steel shot over night to prepare a magenta pigment dispersion. SQS (0.04 g) and Resin I (0.7 g) were dissolved in 9.8 g of 2-propanol. To 3.0 g of the magenta pigment dispersion was slowly added 3.0 g of the SQS solution with vigorous agitation to give a homogeneous mixture which was coated, exposed, processed, and evaluated as in Example 5 using a 60 lines/cm screen.

At about 400 mJ/cm$^2$ exposure energy, a high density high resolution bright magenta image with dots of sharp edges was obtained. Reflective optical density: 1.76. Dot range: 5–99%.

Example 10

A mixture of 1.2 g of Enduraphthal® Blue BT-617 pigment (Cookson Pigments, Newark, N.J.), 1.2 g of Resin III solution, 0.1 g of glycolic acid, and 9.5 g of deionized water was roll-milled with 25 g of 3/32" steel shot over night to prepare a cyan pigment dispersion. To 3.0 g of the cyan pigment dispersion was slowly added 3.0 g of the SQS solution in Example 5 with vigorous agitation to prepare a homogeneous mixture which was coated, exposed, processed, and evaluated as in Example 5 using a 60 lines/cm screen.

At about 600 mJ/cm$^2$ exposure energy, a high density high resolution bright cyan image with dots of sharp edges was obtained. Reflective optical density: 2.15. Dot range: 10–95%.

Example 11

A mixture of 2.0 g of carbon black fw18 pigment, 3.7 g of Resin III solution, 0.2 g of glycolic acid, and 14.1 g of deionized water was roll-milled with 25 g of 3/32" steel shot over night. The resulting pigment dispersion was coated, exposed, processed, and evaluated as in Example 5 except that a 60 lines/cm screen was used.

At about 600 mJ/cm$^2$ exposure energy, a high density high resolution black image with dots of sharp edges was obtained. Reflective optical density: 2.40. Dot range: 5–95%.

Example 12

A mixture of 1.2 g of carbon black fw18, 1.5 g of Resin IV solution, and 9.3 g of deionized water was roll-milled with 25 g of 3/32" steel shot over night to prepare a black pigment dispersion. A resin solution was prepared by dissolving 0.2 g of Resin I in 2.8 g of 2-propanol. The resin solution was slowly added to 2.0 g of the black pigment dispersion with vigorous agitation to give a homogeneous mixture. It was coated, exposed, processed, and evaluated as in Example 5.

At about 600 mJ/cm$^2$ exposure energy, a high density high resolution black image with dots of sharp edges was obtained. Reflective optical density: 2.05. Dot range: 2–95%.

Example 13

A mixture of 1.2 g of Monastral® Magenta RT-143D pigment, 1.5 g of Resin IV solution, and 9.3 g of deionized water was roll-milled with 25 g of 3/32" steel shot over night to prepare a magenta pigment dispersion. To 3.0 g of the magenta pigment dispersion was slowly added 3.0 g of the SQS solution in Example 6 with vigorous agitation to give a homogeneous mixture. It was coated, exposed, processed, and evaluated as in Example 5 using a 60 lines/cm screen.

At about 600 mJ/cm$^2$ exposure energy, a high density high resolution bright magenta image with dots of sharp edges was obtained. Reflective optical density: 1.75. Dot range: 5–98%.

What is claimed is:

1. An aqueous processable element for thermally-induced photoimaging, said element comprising, in order:

(A) a dimensionally stable support, and (B) an active layer comprising:

(1) a cationic polymer containing pendant ammonium groups, said cationic polymer being removable from said support by aqueous processing, said pendant groups having the general formula:

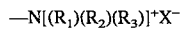

$$-\mathrm{N}[(R_1)(R_2)(R_3)]^+X^-$$

wherein:

$R_1$, $R_2$, and $R_3$ are independently selected from the group consisting of hydrogen, substituted and unsubstitued alkyl, substituted and unsubstituted alkenyl, and substituted and unsubstituted aryl;

$R_1$, $R_2$, and $R_3$ together contain not more than about thirty carbon atoms; and $X^-$ is an anion;

(2) an infra-red absorbing material which is non-absorbing in the visible; and (3) a colorant.

2. The element of claim 1 wherein said infra-red absorbing material is 4-[[3-[[2,6-bis(1,1-dimethylethyl)- 4H-thiopyran-4-ylidene]methyl]-2-hydroxy-4-oxo-2 -cyclobuten-1-ylidene]methyl-2,6-bis(1,1-dimethylethyl) thiopyrylium hydroxide, inner salt.

3. The element of claim 1 wherein said support is polyethylene terephthalate film.

4. The element of claim 1 wherein said cationic polymer is a copolymer of an amine containing monomer with methyl methacrylate, wherein the amines are converted to quaternary ammonium form: (1) by reaction with a carboxylic acid or a mineral acid or (2) by reaction with an alkylating group containing seven or fewer carbon atoms.

5. The element of claim 4 wherein $R_1$, $R_2$, and $R_3$ are independently selected from the group consisting of hydrogen, methyl, ethyl, n-propyl, i-propyl, and benzyl.

* * * * *